United States Patent [19]

Bentley et al.

[11] 3,762,574

[45] Oct. 2, 1973

[54] GUIDE AND MOUNTING SUPPORT WITH POSITIVE MEANS FOR CAPTIVATING A PRINTED CIRCUIT CARD DISPOSED THEREON

[75] Inventors: Robert W. Bentley, Penfield; Arthur B. Cieslak, Rochester, both of N.Y.

[73] Assignee: Stromberg-Carlson Corporation, Rochester, N.Y.

[22] Filed: May 5, 1971

[21] Appl. No.: 140,363

[52] U.S. Cl. ......... 211/41, 317/101 DH, 339/17 LM

[51] Int. Cl. ......................... H05k 7/18, A47g 19/08

[58] Field of Search ............... 317/101 DH, 101 CB; 211/41, 40; 339/17 LM, 91 R, 75 MP, 17 L, 112, 65; 312/10; 206/73, 62 R

[56] References Cited

UNITED STATES PATENTS

| | | | |
|---|---|---|---|
| 2,832,475 | 4/1958 | Linsley | 211/26 |
| 3,368,115 | 2/1968 | Hoffman | 317/101 DH UX |
| 3,447,037 | 5/1969 | Nissim | 317/101 DH |
| 3,623,127 | 11/1971 | Glenn | 317/101 DH X |
| 3,693,135 | 9/1972 | Vavrick | 317/101 DH X |
| 3,715,630 | 2/1973 | Kuhl | 211/41 X |
| 1,716,086 | 6/1929 | Pope | 101/381 |
| 2,825,037 | 2/1958 | French | 339/17 LM |
| 2,968,019 | 1/1961 | Steinman | 339/17 LM X |
| 3,216,580 | 11/1965 | Fricker | 211/41 |
| 3,231,785 | 1/1966 | Calabro | 339/17 LM X |
| 3,320,483 | 5/1967 | Pohl | 211/41 UX |
| 3,382,476 | 5/1968 | Novet | 317/101 DH X |
| 3,404,785 | 10/1968 | Emary | 211/41 UX |
| 3,476,983 | 11/1969 | Robertis | 317/101 DH |

FOREIGN PATENTS OR APPLICATIONS

| | | | |
|---|---|---|---|
| 1,109,701 | 4/1968 | Great Britain | 317/101 DH |
| 1,225,189 | 3/1971 | Great Britain | 317/101 DH |
| 95,100 | 1/1963 | Denmark | 312/10 |
| 47,937 | 5/1966 | Germany | 317/101 DH |
| 1,578,065 | 8/1969 | France | 211/41 |
| 1,200,409 | 9/1965 | Germany | 339/91 R |
| 454,998 | 6/1968 | Switzerland | 317/101 DH |

OTHER PUBLICATIONS

IBM Technical Disclosure Bulletin, Cable Card Retention, by Frisbie, page 974, Vol. 11, No. 8, Jan. 1969.

*Primary Examiner*—Roy D. Frazier
*Assistant Examiner*—Abraham Frankel
*Attorney*—Charles C. Krawczyk

[57] ABSTRACT

A guide and support mounting member provides supporting means and flexible positive captivating means for a printed circuit card disposed within a guide channel.

14 Claims, 9 Drawing Figures

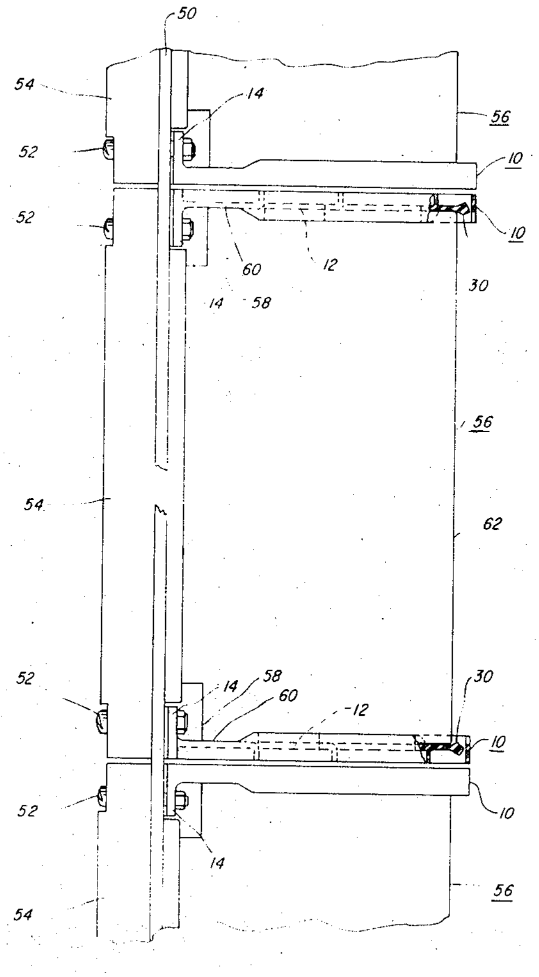

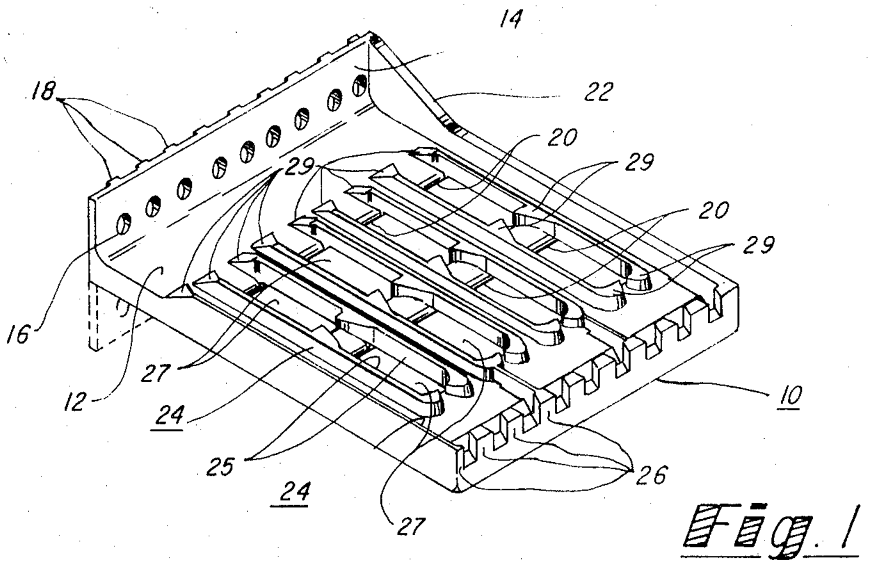
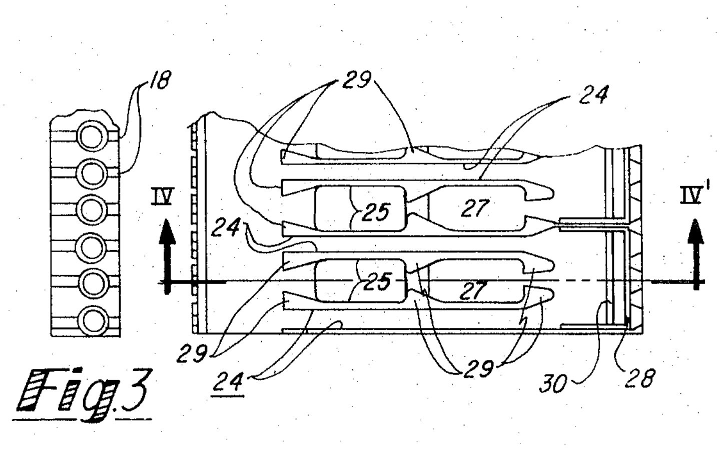
Fig. 3 Fig. 2
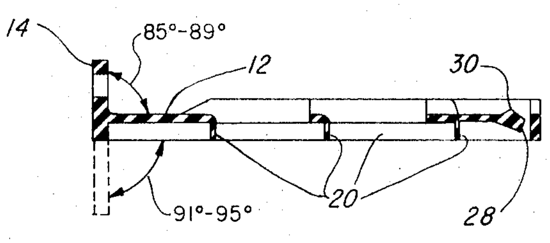
Fig. 4
A. B. CIESLAK
R.W. BENTLEY
INVENTORS
BY Charles C. Krawczyk
Donald M. Winegar
ATTORNEYS

INVENTORS
A.B. CIESLAK
R.W. BENTLEY

BY Charles C. Krawczyk
Donald M. Winegar
ATTORNEYS

A.B. CIESLAK
R.W. BENTLEY
*INVENTORS*

BY Charles C. Krawczyk
Donald M. Winegar
*ATTORNEYS*

A. B. CIESLAK
R. W. BENTLEY
INVENTORS

BY Clarke C. Krawczyk
Donald M. Winegar
ATTORNEYS

GUIDE AND MOUNTING SUPPORT WITH POSITIVE MEANS FOR CAPTIVATING A PRINTED CIRCUIT CARD DISPOSED THEREON

BACKGROUND OF THE INVENTION

This invention relates to printed circuit card guides and, in particular, to a printed circuit card guide having menas for positive captivation of a printed circuit card mounted thereon.

This application relates to improvements and alternate embodiments thereof, of the subject matter of copending patent application, Ser. No. 140,364, filed on May 5, 1971, by Gerbrand Druyff, entitled "Guide and Mounting Support Member For Captivating A Printed Circuit Card Disposed Thereon", now abandoned.

Printed circuit cards are generally mounted vertically or horizontally in guide and mounting assemblies. Electrical connection to the circuitry of the card is accomplished through an edge connector which is also relied upon to hold a card captive in place. The guide and mounting aassembly is employed to assist the alignment of the card with the edge connector. A rigid notch arrangement has been employed in the past in association with a channel guide for assuring proper alignment of the card with the connector as described in the U.S. Pat. No. 3,567,498. In addition, a detent is provided on the card that matches with the notch on the guide if the proper card is inserted into the guide.

The detent-notch guide arrangement overcomes some of the prior art difficulties in reducing, to some degree, the occurrence of skewed connections between the contacts on a printed circuit board and terminals in the edge connector. Occurrence of a skewed connection results in inoperative circuits, high contact resistance and/or undesirable cross-connection of circuits not designed to be connected to each other. However, this detent-notch arrangement of the prior art does not provide a flexible arrangement for receiving and withdrawing printed circuit boards wherein some effort is required upon the part of an installer to insert and withdraw the printed circuit card from a modular assembly. In addition to the foregoing, each time a different printed circuit board is to be inserted into a given connector (due to design changes, etc.) the guide would have to be changed to provide a new notch arrangement that would correspond to a new detent location on the new card, or else there may be more than one card that can be inserted into a given connector, which at times may cause problems.

Some equipment incorporating mounting of printed circuit cards are subject to periodic shock loading. Continuous periodic shock loading causes the cards to work loose from the edge connectors thereby causing high contact resistance between the connector and the contacts of the cards. As a result, intermittent or a complete loss of operation of the circuitry of the card may result. In extreme cases of continuous periodic shock loading such, for example, as in airborne or vehicle mounted equipment, cards vibrate loose from the connector and fall from the equipment resulting in damage to the card as well as a loss of operation of the circuitry of the card involved.

Occasionally, a printed circuit card of greater length than usual must be assembled utilizing the same guide mount structure. In such instances, the guide mount must be readily adaptable for modification whenever the need arises.

An object of this invention is to provide a new and improved guide and mounting support member suitable for use with printed circuit cards whereby the deficiencies of the prior art guide mounts are corrected.

An object of this invention is to provide a new and improved easily mountable, readily adaptable, printed circuit card guide and mounting support member.

Another object of this invention is to provide a new and improved guide and mounting support member suitable for use with one or more printed circuit cards and incorporating means for adequate cooling of, and means for the positive captivation of, cards mounted thereon.

Other objects will, in part, be obvious and will, in part, appear hereinafter.

BRIEF DESCRIPTION OF THE INVENTION

In accordance with this invention, there is provided an assembly for mounted printed circuit cards. The assembly comprises a generally planar base having two major opposed surfaces. A mounting flange is affixed to one edge of the base, the flange being formed with at least one aperture for mounting the assembly. A plurality of elongated dividers extend from the base in a direction generally normal to the plane of the base. The dividers define therebetween a parallel planar array of first channels extending in a direction towards the edge affixed to the flange member for guiding and receiving an edge of a separate printed circuit card. A plurality of resilient detent means is affixed to the base. Each detent means traverses at least one of the first channels and includes an end extending into the channel it traverses. The plurality of resilient detent means is affixed to the base for pivotal movement in a direction normal to the plane of the base so that it is forced away as a printed circuit board is inserted into the channel and pivots back up to capture the end of the board or a notch cut there-in.

A further feature of the invention includes the use of resilient extension support members attached to the base to extend beyond the base to further capture elongated cards that extend beyond the base.

DESCRIPTION OF THE DRAWINGS

FIG. 1 is an isometric view of a guide and support mounting member of the invention;

FIG. 2 is a top planar view of a portion of the member of FIG. 1;

FIG. 3 is a side view of the portion of the member of FIG. 2;

FIG. 4 is a side view, partly in cross section, of the portion of the member of FIG. 2 taken along the plane IV–IV';

DESCRIPTION OF THE INVENTION

Figure 5:
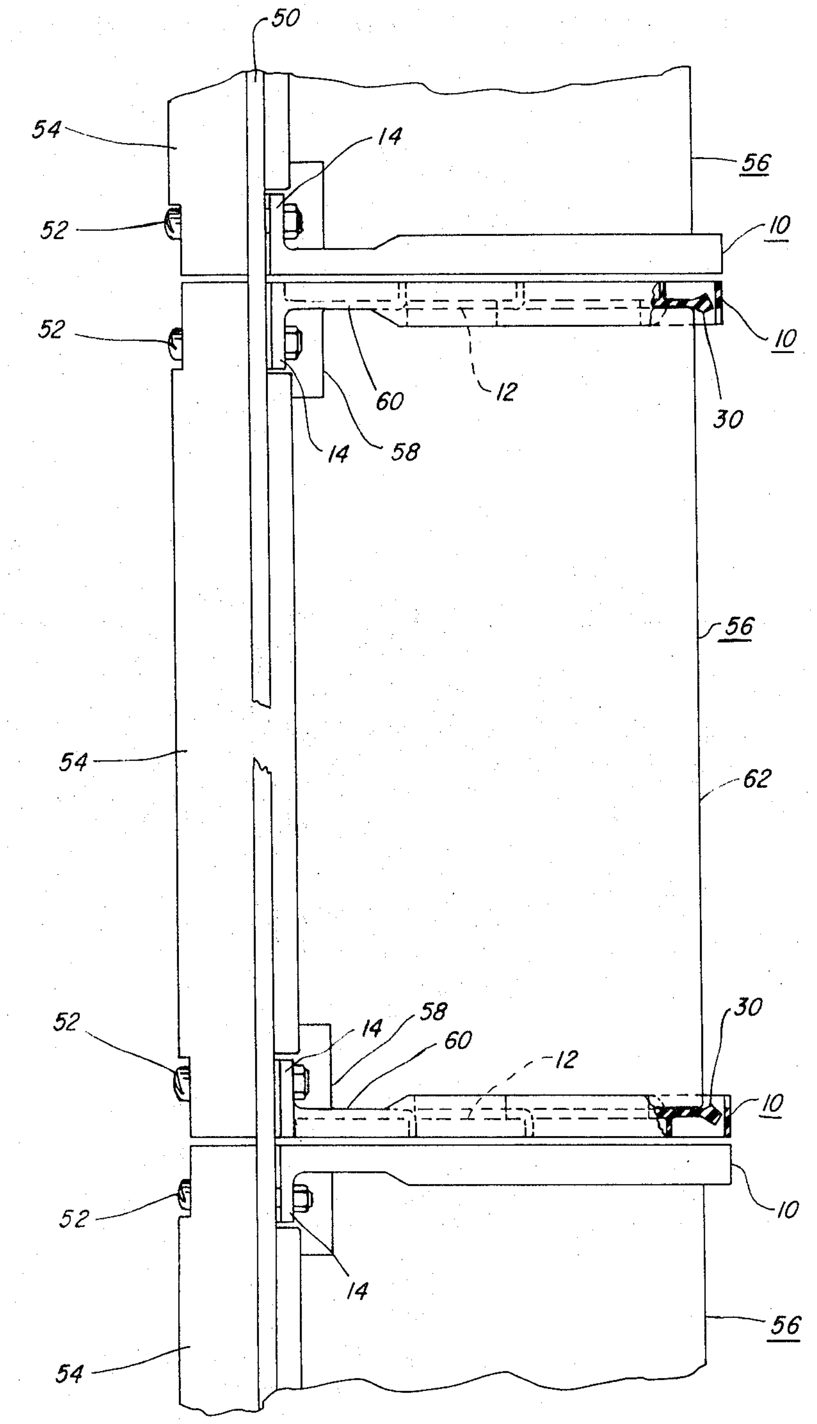
FIG. 5 is a side view illustrating the utility of the member of FIG. 1 in a printed circuit module.

With reference to FIGS. 1 through 4, there is shown a single guide and support member 10 adapted to form a portion of a mounting arrangement for guiding and receiving printed circuit boards. The member 10 may be fabricated from individual components suitably joined together or it may be molded by suitable means such, for example, as by injection molding, as a complete unit. The material comprising the member 10 may be metal or a suitable non-metallic material. Preferably, the member 10 is molded in one piece and comprises an electrically insulating non-metallic material. To impart additional strength to the member 10, the non-metallic material may be reinforced by a filler material. Suitable materials for making the member 10 are cured thermoplastic resins such, for example, as fiber glass filled nylon.

The mounting member 10 comprises a base 12 and a longitudinal flange member 14 attached to, or integral with, the rear edge of the base 12 extending generally normal to the base 12. The base 12 is substantially flat and has opposed major faces forming top and bottom surfaces as viewed in FIG. 1. Within the flange member 14, there is located a plurality of mounting holes 16 suitable for use with hardware for mounting the support member 10 to any suitable mounting surface. Vertical stiffeners 18 may be added to the member 14 to provide additional support to the flange member as well as to compensate for any surface irregularities which may occur in the surface to which the support member is mounted. The flange member 14 may extend vertically above, below (as illustrated in phantom), or both above and below the base. Support for the base 12 may be provided by a plurality of spaced transverse and longitudinal stiffening ribs 20. The ribs 20 may be either attached to the base individually, or may form an integral part of the base. When required, additional support for the base may be provided by providing stiffening members 22 at either end of the guide and support mounting member and optionally at spaced intervals therebetween. These stiffening members 22 may be attached to, or be integral with, either one of, or both, the base 12 and the flange member 14.

A parallel array of a plurality of thin elongated divider members 24 are disposed on, or integral with, in a direction normal to, the top surface of the base 12. Each member 24 has at least one wall aligned substantially parallel to, and opposed to, a wall of an adjacent dividing member, thereby defining an individual channel for guiding and laterally supporting an end of a printed circuit card disposed therein. The members 24 define a parallel planar array of guides for receiving an end of a printed circuit. A positive means for guiding a printed circuit card into the channels is provided along the length of the member 10 by a plurality of vertical ribs 26 mounted along the front edge of the member 10. Opposed substantially vertical walls of adjacent pairs of ribs 26 define a guide for receiving a printed circuit card. This guide is aligned with the channel defined by an adjacent pair of divider members 24. The opposed surfaces of adjacent pairs of ribs 26 may be chamferred to provide for easy insertion of a printed circuit card.

If desired, alternate dividers 24 can provide additional channels for receiving and holding a printed circuit card. The opposed wall surfaces 25 of pairs of divider member 24 (except for the ones on the end of the member 10) include projections 29 that face each other. The projections 29 define additional channels aligned with separate ones of the guides 26 for receiving another card between each pair of divider members 24.

Along the length of the guide and support member 10, there is a plurality of flexible members 28 attached to the base 12 so that it is capable of being pivoted in a direction substantially normal to the plane of the base 12. A raised ridge or a detent 30 is provided at the free end of the flexible member 28. A portion of the flexible member 28 including the detent 30 is aligned with, and spans, at least one or more channels. In the embodiment illustrated, a detent spans three channels.

As a printed circuit card is inserted into one of the channels. the edge of the card upon contacting the detent 30 causes the flexible member 28 to pivot away permitting the card to be inserted all the way onto the guide and mounting member. When the card has been fully inserted and has cleared the detent 30, the flexible portion 28 pivots back to a point wherein the detent 30 protrudes beyond the edge of the card, thereby restricting the movement of the card and thereby positively captivates the card in the channel.

It is preferred that the angle formed by the intersection of a plane comprising the member 14 and a plane comprising the base 12 be from 85° to 89°. This preferred angle provides a means for the positive engagement of a printed circuit card by the detent 30.

Printed circuit cards often comprise circuitry and components mounted thereon which require means for natural or forced circulation of a coolant medium to dissipate the thermal energy generated. Therefore, it is desirable that openings be provided in the guide and support mounting member 10 to permit circulation of a coolant about substantially all of both surfaces of the card. It has been found that if the member 10 has a plurality of printed circuit cards mounted thereon, that apertures comprising at least approximately 25 percent the surface areas of the base 12 should be provided as a means for circulating a coolant therethrough. One or more apertures 27 extend through the base 12 along the channel defined by the projections 29 to provide a path for ventilation. The surfaces 25 of the members 24 are contoured to allow the apertures 27 to utilize as much of the surface area of the base as possible to provide optimum cooling and still provide the required strength.

Figure 6:
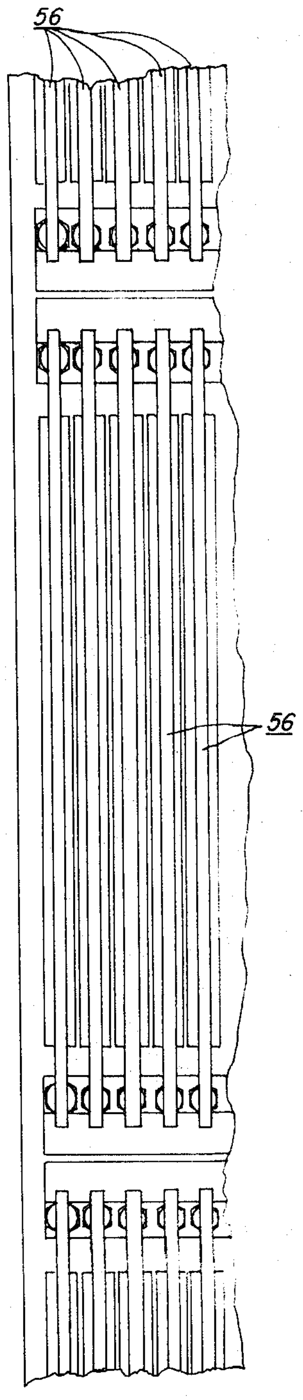
FIG. 6 is a front view of the module of FIG. 5.
Figure 7:
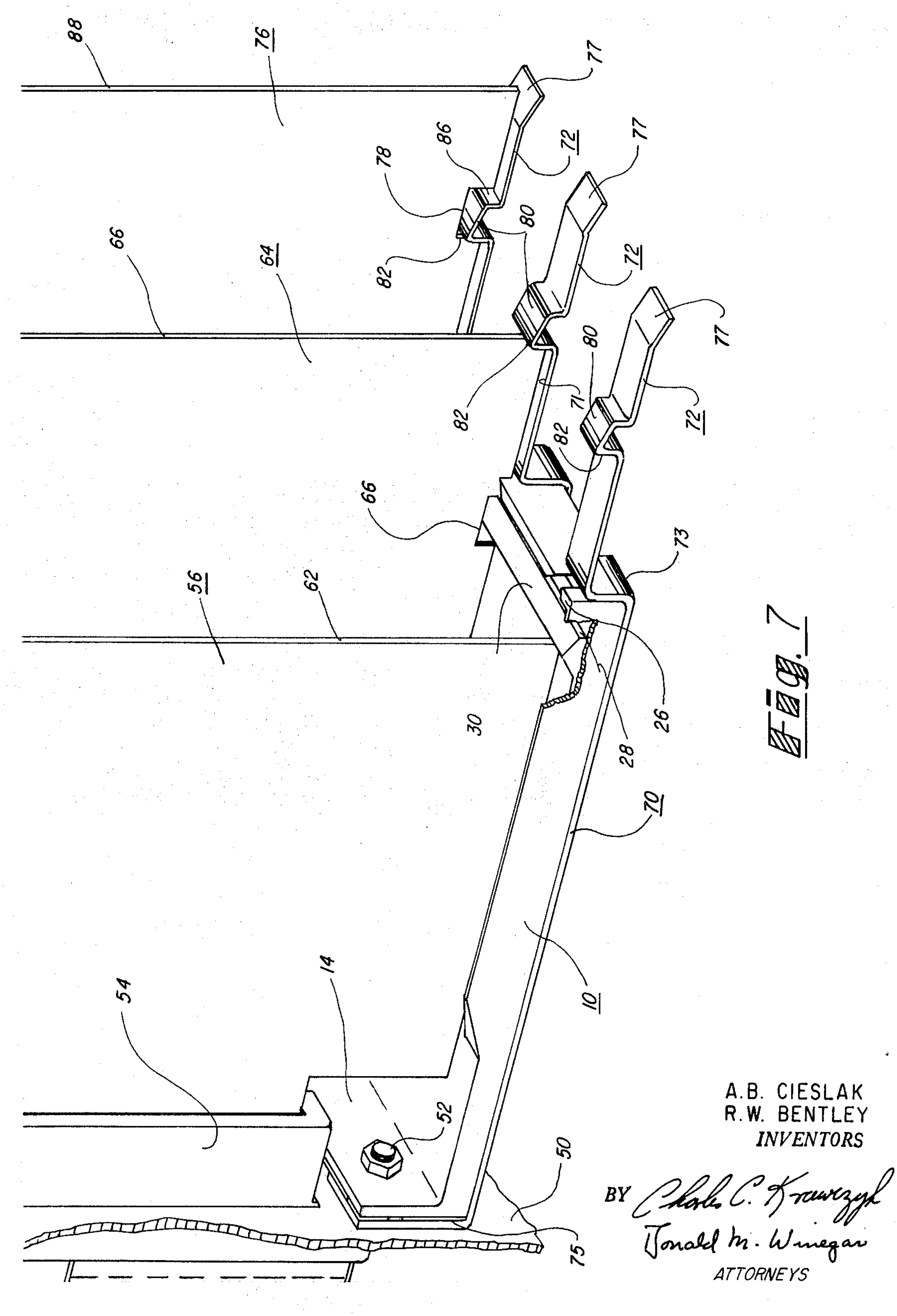
FIG. 7 is an isometric view, partly in cross section, of various embodiments of the mounting member.

Referring now to FIGS. 5, 6 and 7, the guide members are mounted in pairs to provide a complete guide for receiving and holding a printed circuit card in all directions. The cards are mounted either vertically or horizontally. An electrical connector, into which the electrical contacts of an associated printed circuit card are inserted, is affixed to a suitable mounting panel 50. For purposes of only illustrating the utility of the guide and support member 10 of this invention, the card and its associated connector are illustrated as being mounted in a vertical plane in FIGS. 5, 6 and 7.

A plurality of members 10 are affixed to a mounting panel 50 of a wiring frame by suitable fastening means 52, such, for example, as a nut and a bolt, a screw, and the like. The fastening means 52 extend through the panel 50 and a mounting hole 16 of the member 14 to secure the member 10 to the panel 50. The same fastening means 52 may also be used, as shown, to affix an electrical connector 54 to the panel 50. A portion of the connector 54 projects through an aperture in the panel 50.

A pair of support members 10 are mounted in a suitable manner whereby the bases 12 are in generally parallel planes and with the respective channels of each member 10 opposite and parallel to those of the other. The bases 12, as measured near the flange member, are spaced apart from each other at least the distance equal to the length of a printed circuit card 56 to be inserted between the members 10. The ends of the leading edge of the card 56 are notched at 58 to provide clearance for the flange 14 of each support member 10. The card 56 is mounted by inserting the card 56 into a pair of opposed channels of the members 10. The preferred angle configuration of each member 10 causes the members 10 to converge. As a printed circuit card is inserted, the members 10 are forced apart to permit entry into the channels. The side edges 60 of the card 56 engage the detent 30 causing the flexible member 28 to pivot away. The pairs of channels are aligned with the individual contacts in the connector 54 so that the contact edges of the card 56 are guided into the connector 54 with the contacts on the card aligned with the contacts in the connector to prevent skewing. When the electrical contacts of the card 56 are inserted to the proper depth of the connector 54, the trailing edge 62 clears the detent 30 of each support member 10 and the flexible members 28 pivot back so that two detents 30 engage the edge 62. The card is now captivated by the combination of the channels, the connector, and the detents. The angle between the base 12 and member 14 is designed to assure one that the opposed detents 30 will project beyond the trailing edge 62 of the card 56 to captivate the card 56 in place. Vibration and shock loading of the card 56 cannot now easily loosen the card 56 from the connector 54 as was possible in prior art assemblies. Therefore, the problem of intermittent or complete failure of operation of the circuitry and elements mounted on the card 56 is substantially eliminated.

To remove card 56, one need only pull the card straight out. As the card is withdrawn, the opposed detents 30 are forced apart and the card is easily removed from the assembly. Upon removal of the cards, each of the flexible members 28 pivots back to its normal position.

Occasionally, it is necessary to employ printed circuit cards of various widths intermixed with each other. Therefore, it is necessary that the support member 10 have the capability of being readily adaptable to accommodate printed circuit cards that extend beyond the front edge of the member 10.

In one embodiment of FIG. 7, a printed circuit card 64, similar to the card 56, but having a greater width, is mounted within the mounting member 10 in a channel adjacent the card 56. The trailing edge 66 of the card 64 extends beyond the front edge of the members 10. To captivate the card 64 in place, a notch 66 is provided in one or both ends of the card 64 to enable the detent 30 of each member 10 to lock the card 64 in place. Insertion and removal of the card 64 relative to the detent 30 is accomplished in the same manner as previously described for the printed circuit card 56.

To support the additional width of the card 64, it may be desirable to employ a resilient extension support member 70. The member 70 may be made from round wire stock but it is preferably a flat member having opposed major surfaces substantially parallel to each other. The member 70 is disposed in a suitable manner wherein its longitudinal axis is substantially parallel to, and lays in a plane common with one of the longitudinal axes of the channels of the member 10 to accommodate one or more oversized printed circuit cards. The member 70 is preferably made of a material such, for example, as a ferrous base or a copper base metal having spring temper properties. The extension support member 70 has an upwardly extending bend 73 including an angle of approximately 90° relative to the bottom branch of member 70. The angle is preferably equal to that of the end of the member 10 which it is being used to follow. An aperture is disposed within the opposite end 75 of the member 70 for receiving the mounting hardware 52 for affixing both the member 10 and the extension support member 70 to the mounting panel 50. The portion of the extension support member 70 between end 75 and bend 73 is suitably formed to follow the outer contour of the member 10. An extended portion 72 protrudes beyond the front edge of the member 10 and follows the edge of the card. The support member 70 is therefore in an abutting contact with the outer surface of the member 10 and also with a portion of the card 64. The free end 77 of the member 70 may be formed with a sloped end and have a bend to extend away from the board. The free end 77 enables one to force the member 70 away from the card 64 to facilitate the insertion and withdrawal of the card 64 as well as to enable the abutting surfaces of the card 64 and the member 70 to slide easily relative one to the other. The guide ribs 26 (FIG. 1) are preferably designed to provide sufficient clearance between the member 70 and the flexible member 28 to provide sufficient pivotal motion.

An integral generally U-shaped bend 80 is formed in the member 70 and projects from the upper surface of the member 70 toward the board. The forward edge portion 82 abuts the trailing edge 66 of the card 64 to positively captivate the card 64 in place. Thus, the card is captivated by both the U-shaped bend 80 and the detent 30.

An additional embodiment of the adaptability of the resilient extension support member 70 is also shown in FIG. 7. A printed circuit card 76 is mounted in channels of the support member 10. In addition to the notch 66, the card 76 has an additional notch 78 in a portion of the card which is engaged by the member 70. The U-shaped bend 80 is of a sufficient height to project upwardly into the notch 78 and captivate the card 76 in place. The sloped end portion 77 enables one to easily apply a force to the member 70 to pivot the member 70 away from the end of the card 76 to disengage the U-shaped bend 80 from the notch 78 to facilitate the insertion and withdrawal of the card 76 from the modified support 10. The U-shaped bend 80 may be fabricated with the forward edge portion 82 of a greater height than a trailing edge portion 86 to enable the card 76 to slide more easily over the U-shaped bend 80 and facilitate the insertion of the card 76 into the aligned channel of the member 10.

Figures 8, 9:
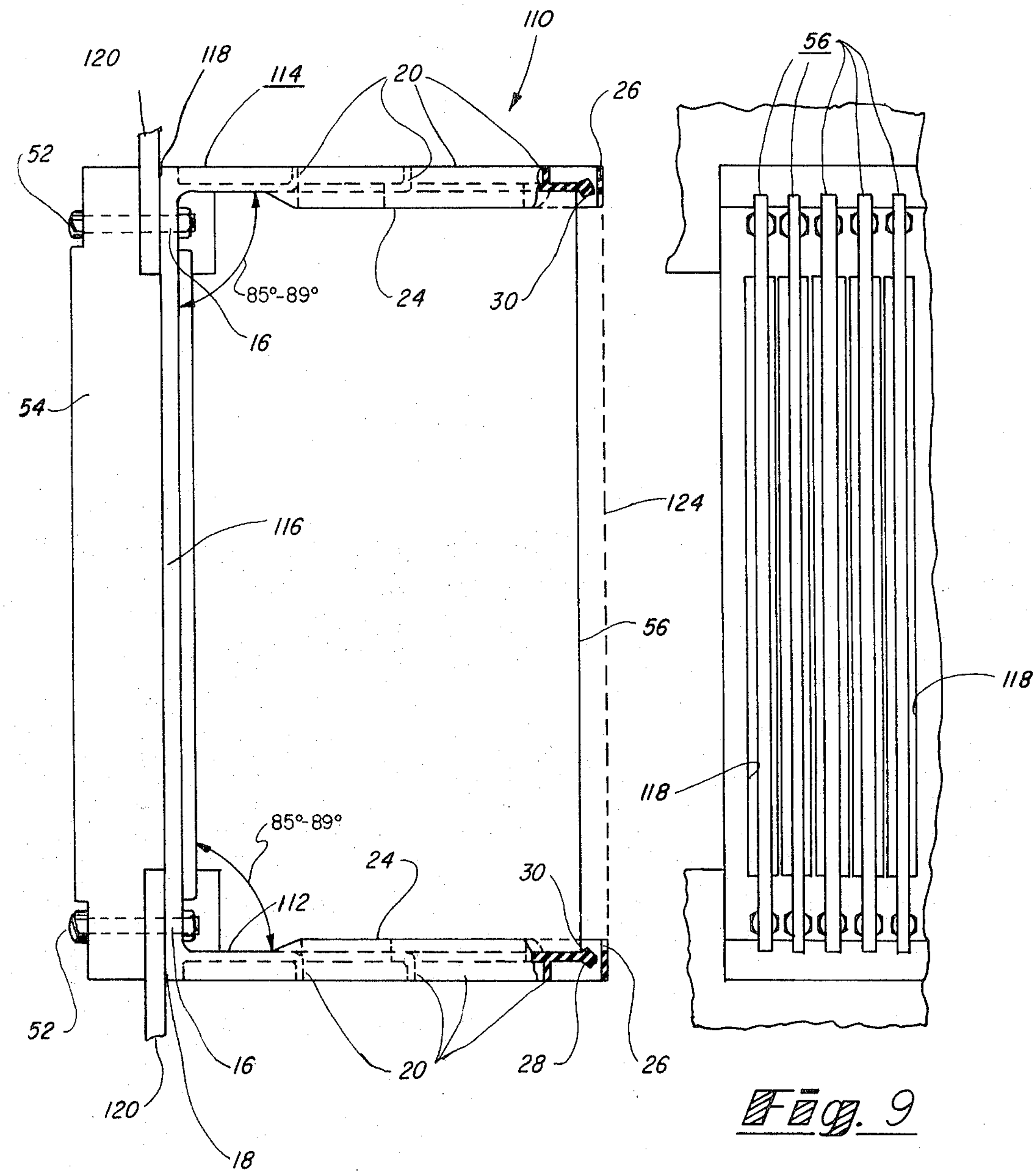
FIG. 8 is a side view, partly in cross section, of a modular assembly including the mounting member of the invention.
FIG. 9 is a front view of the modular assembly of FIG. 8.

With reference to FIGS. 8 and 9, there is shown a modular assembly 110 comprising two opposed guide aand support members, 112 and 114, similar to the member 10 of FIGS. 1–7 and with a mounting panel 116 joined to the two members 112 and 114 in a unitary assembly. The elements of each of the support members 112 and 114 function in the same manner as the elements of the support member 10 and the component parts thereof are designated by the same reference numerals disclosed heretofore.

The mounting panel 116 is integral with the ends of the members 112 and 114. The panel 116 is comprised of the same materials as the member 10. The assembly 110 may accommodate one or more printed circuit boards mounted therein. The panel 116 is therefore provided with a plurality of apertures 118, each aperture being aligned with one or more of the channels of the members 112 and 114. Any one, or a combination of more than one, of the printed circuit cards 56, 64 and 76 illustrated in FIG. 7 may be mounted in the assembly 110, and if required, employing the required embodiment of the extension support member 70. A connector 54 is inserted through an aperture 118 of the panel 116, and both the connector 54 and the assembly 110 are fastened to a suitable support framework 120 by fastening means 52. The printed circuit cards are mounted in the assembly 110 in the same manner as previously described with reference to FIGS. 5 and 6. The resilient extension support member 70 may be used in the same manner with each of the members 112 and 114 as it is employed with the member 10 in FIG. 7. As an alternative, when oversized printed circuit cards are employed in the modular assembly, only one resilient extension support member 70 may be utilized with either the member 112 or the member 114 to captivate a card in place. Preferably, it is desirable to use two members 70, one for each of the members 112 and 114, to positively captivate one card whenever there is a need for a member 70.

A side panel 124 may be provided on one or both sides of the assembly 110 to partially enclose the boards therein. It is to be appreciated, of course, that with such a provision of side panels, which may be integral with the members 112 and 114 as well as with the panel 116, the included angle between the panel 116 and each of the respective members 112 and 114 is preferably 90° to provide a uniform distance between the opposed channels of the members 112 and 114 over the entire length of the channel.

What is claimed is:

1. A sub-assembly for mounting printed circuit cards comprising:

a generally planar base formed with a plurality of apertures and having two major opposed surfaces;

a mounting flange affixed to one edge of said base, said flange being formed with at least one aperture for mounting the assembly;

a plurality of elongated dividers extending from said base in a direction generally normal to the plane of the base providing a parallel planar array of first channels spaced apart, said channels being defined by pairs of adjacent dividers extending in a direction towards said flange for guiding and receiving an edge of a separate printed circuit card;

a plurality of rigid projections, each extending from a different divider toward a projection from the adjacent divider of the adjacent channel for defining a parallel planar array of second channels parallel to and located intermediate said first channels for receiving an edge of a separate printed circuit card each one of said second channels spanning at least one of the apertures;

a plurality of resilient detent means affixed to the base, wherein each detent means traverses at least a pair of adjacent first and second channels and includes an end extending towards the channels it traverses, and is affixed to said base for automatic pivotal movement in a direction normal to the plane of said base upon contact with a moving edge of a printed circuit card whenever the card is inserted or removed from one of its traversed channels, and a planar array of a plurality of ribs disposed along the front edge of said base forward of said plurality of detent means extending from said base in a direction generally normal to the plane of said base, defining therebetween a parallel planar array of openings, each of the openings being aligned with an individual one of said first and second channels.

2. A sub-assembly as defined in claim 1 wherein:

the angle between the base and the mounting flange is from 85° to 89°.

3. A sub-assembly as defined in claim 1 including:

a resilient extension member mounted to said base and having a configuration wherein a portion of the surface of said resilient extension member is suitably formed to follow the contour of the surface of said base opposite the surface including the elongated dividers and is in abutting contact therewith, said resilient extension member extending beyond the front edge of said base and having a longitudinal axis substantially parallel to and in alignment with the longitudinal axis of at least one of the channels of said base.

4. A sub-assembly as defined in claim 3 wherein:

the angle between the base and the mounting flange is from 85° to 89°.

5. A sub-assembly as defined in claim 1 including:

a plurality of spaced longitudinal stiffening ribs affixed to the surface of said base opposite the surface including the elongated dividers.

6. A sub-assembly as defined in claim 5 including:

at least one stiffening member joining said longitudinal mounting flange to said base.

7. A sub-assembly as defined in claim 1 including:

a resilient extension member having a configuration wherein a portion of the surface of said resilient extension member is suitably formed to follow the contour of said base and is in abutting contact therewith, said resilient extension member extending beyond the front edge of said base and having a longitudinal axis substantially parallel to and in alignment with the longitudinal axis of one of said channels of said base.

8. A sub-assembly as defined in claim 7 including:

a generally U-shaped bend portion projecting upwardly from the top surface of said resilient extension support member.

9. A sub-assembly as defined in claim 1 wherein said apertures comprise at least 25 percent of the area of each of the two major opposed surfaces of said base.

10. An assembly for mounting printed circuit cards comprising:

a pair of generally planar bases, each formed with a plurality of apertures and having two major opposed surfaces;

a pair of mounting flanges, each flange being affixed to one edge of separate ones of said bases, said flange being formed with at least one aperture for mounting the assembly;

a plurlaity of elongated dividers on each of said bases extending from said bases in a direction generally normal to the plane of the base providing a parallel planar array of first channels spaced apart, said channels being defined by pairs of adjacent dividers extending in a direction towards said flange for guiding and receiving an edge of a separate printed circuit card;

a plurality of rigid projections, each extending from a divider toward a projection from the adjacent divider of the adjacent channel from defining a parallel planar array of second channels parallel to and located intermediate said first channels for receiving an edge of a separate printed circuit card, each one of said second channels spanning at least one of the apertures;

a plurality of resilient detent means affixed to each of said bases, wherein each detent means traverses at least a pair of adjacent first and second channels and includes an end extending towards the channels it traverses, and is affixed to the base for automatic pivotal movement in a direction normal to the plane of the base upon contact with a moving edge of a printed circuit card whenever the card is inserted or removed from one of its traversed channels;

a planar array of a plurality of ribs disposed along the front edge of each of the bases forward of said plurality of detent means extending from each base in a direction generally normal to the plane of said base, defining therebetween a parallel planar array of openings, each of the openings being aligned with an individual one of said first and second channels, and wherein said pair of bases are mounted by said mounting flanges having the channels of the bases lying in corresponding parallel planes.

11. An assembly as defined in claim 10 wherein:

the angle between the base and the mounting flange is from 85° to 89°.

12. An assembly as defined in claim 11 including:

a resilient extension mmember mounted to at least one of said bases having a configuration wherein a portion of a surface of said resilient extension member is suitable formed to follow the contour of the surface of said base opposite the surface having the elongated dividers and is in abutting contact therewith, said resilient extension member extending beyond the front edge of said base and having a longitudinal axis substantially parallel to and in alignment with the longitudinal axis of one of the channels on said base.

13. An assembly as defined in claim 10 including:

a side panel affixed to, and joining together, the opposed ends of said pair of bases.

14. An assembly of claim 13 including:

a resilient extension member having a configuration wherein a portion of a surface of said resilient extension member is suitably formed to follow the contour of the surface of said base opposite the surface having the elongated dividers and is in abutting contact therewith, said resilient extension support member extending beyond the front edge of said base and having a longitudinal axis substantially parallel to and in alignment with the longitudinal axis of one of the channels of said base.

* * * * *